US012808951B2

(12) United States Patent
Kantola et al.

(10) Patent No.: US 12,808,951 B2
(45) Date of Patent: Nov. 24, 2026

(54) METHOD FOR DETERMINING LEAKAGE IMPEDANCE OF TRANSFORMER, AND ELECTRIC POWER CONVERTER

(71) Applicant: ABB Schweiz AG, Baden (CH)

(72) Inventors: Timo Kantola, Helsinki (FI); Teemu Salmia, Helsinki (FI); Markus Vilkki, Helsinki (FI); Lauri Peltonen, Helsinki (FI)

(73) Assignee: ABB SCHWEIZ AG, Baden (CH)

( * ) Notice: Subject to any disclaimer, the term of this patent is extended or adjusted under 35 U.S.C. 154(b) by 217 days.

(21) Appl. No.: 18/926,518

(22) Filed: Oct. 25, 2024

(65) Prior Publication Data

US 2025/0138108 A1 May 1, 2025

(30) Foreign Application Priority Data

Oct. 31, 2023 (EP) .................................... 23207068

(51) Int. Cl.
*G01R 31/62* (2020.01)
*H02M 1/44* (2007.01)
*H02M 7/537* (2006.01)

(52) U.S. Cl.
CPC .............. *G01R 31/62* (2020.01); *H02M 1/44* (2013.01); *H02M 7/537* (2013.01)

(58) Field of Classification Search
CPC ........ G01R 31/52; G01R 27/16; G01R 31/62; H02M 1/44; H02M 7/537
See application file for complete search history.

(56) References Cited

U.S. PATENT DOCUMENTS

2018/0083539 A1* 3/2018 Reed ..................... H02M 3/335
2025/0047188 A1* 2/2025 Cao ..................... H02M 1/0058

FOREIGN PATENT DOCUMENTS

CN 103954875 A 7/2014
EP 2807589 B1 3/2018

OTHER PUBLICATIONS

Extended European Search Report; Application No. 23207068.0; Completed Apr. 5, 2024; Issued: Apr. 17, 2024; 8 Pages.

* cited by examiner

*Primary Examiner* — Tung X Nguyen
(74) *Attorney, Agent, or Firm* — Greenberg Traurig, LLP

(57) ABSTRACT

A method for determining a leakage impedance of a transformer and an electric power converter configured to obtain values of a first voltage and a first current in an AC output of the electric power converter, a value of a second current between an output filter connected to the AC output and a primary side of a transformer connected to the output filter and a value of a second voltage on a secondary side of the transformer, wherein the values are obtained when the secondary side of the transformer is disconnected from an AC network, and to determine a leakage impedance of the transformer on the basis of the values of the first voltage, the first current, the second current and the second voltage, and at least one predetermined impedance parameter value of the output filter.

16 Claims, 3 Drawing Sheets

METHOD FOR DETERMINING LEAKAGE IMPEDANCE OF TRANSFORMER, AND ELECTRIC POWER CONVERTER

TECHNICAL FIELD

The present invention relates to a method for determining a leakage impedance of a transformer and to an electric power converter.

BACKGROUND

An electric power converter, such as an inverter or a frequency converter, may be configured to operate in a grid-forming manner or in a grid-following manner. In contrast to grid-following converters, grid-forming converters can make use of their own voltage and frequency references. Grid-forming converters are thus able to create a stable grid voltage, and hence can form and maintain a grid (an AC network), such as a microgrid, on their own without having to rely on e.g. synchronous generators.

An electric power converter may also be able to operate both in the grid-forming manner and in the grid-following manner depending on the situation, for instance. As an example, such converter may operate in the grid-following manner in a grid connected situation, when the converter is connected to a grid with a stable voltage, and in the grid-forming manner in an islanding (islanded) situation, i.e. when the converter is without such grid connection. Sometimes such converter may be referred as an off-grid converter.

When an electric power converter operates in the grid-forming manner and a short-circuit fault occurs in an AC network created by the electric power converter, the electric power converter may be required to provide sufficient short-circuit current to ensure that short-circuit protection, such as fuses, operates reliably. For this reason, the supply capability of the short-circuit current by the electric power converter might have to be known.

The short-circuit current supply capability of the electric power converter may depend, in addition to the characteristics of the electric power converter itself, on various characteristics of components connected between the electric power converter and the AC network where the short-circuit fault occurs. These characteristics of the components connected between the electric power converter and the AC network may not be known in the first place and/or such characteristics may change as a result of components being replaced. A problem related to the above is that consequently the effect of such components on the short-circuit current supply capability of the electric power converter may be unknown or at least the short-circuit current supply capability of the electric power converter cannot be determined accurately enough.

SUMMARY

An object of the present invention is thus to provide a method and an apparatus for implementing the method so as to overcome the above problem or at least to alleviate the problem. The objects of the invention are achieved by a method and an arrangement which are characterized by what is stated in the independent claims. The preferred embodiments of the invention are disclosed in the dependent claims.

The invention is based on the realization to determine by an electric power converter a leakage impedance of a transformer via which the electric power converter is configured to be connected to an AC network.

An advantage of the solution of the invention is that since the leakage impedance of the transformer via which the electric power converter is configured to be connected to the AC network is often one of the most significant factors affecting the supply capability of the short-circuit current by the electric power converter, determining the value of the leakage impedance of the transformer can greatly improve the accuracy of the estimation of the supply capability of the short-circuit current to the AC network by the electric power converter.

BRIEF DESCRIPTION OF THE DRAWINGS

In the following the invention will be described in greater detail by means of preferred embodiments with reference to the accompanying drawings, in which.

DETAILED DESCRIPTION

The following embodiments are exemplary. Although the description may refer to "an", "one", or "some" embodiment(s) in several locations, this does not necessarily mean that each such reference is to the same embodiment(s), or that the feature only applies to a single embodiment, for example. Single features of different embodiments may also be combined to provide other embodiments. Different embodiments and examples may be described below using single units, models and equipment, without restricting the embodiments/examples to such a solution. Generally, all terms and expressions used should be interpreted broadly and they are intended to illustrate, not to restrict, the embodiments. The figures may only show components necessary for understanding the various embodiments. The number and/or configuration of the various elements, and generally their implementation, could vary from the examples shown in the figures, for instance. It should be noted that the use of the embodiments described herein is not limited to devices or systems employing any specific fundamental frequency or any specific voltage level, for example.

Figure 1:
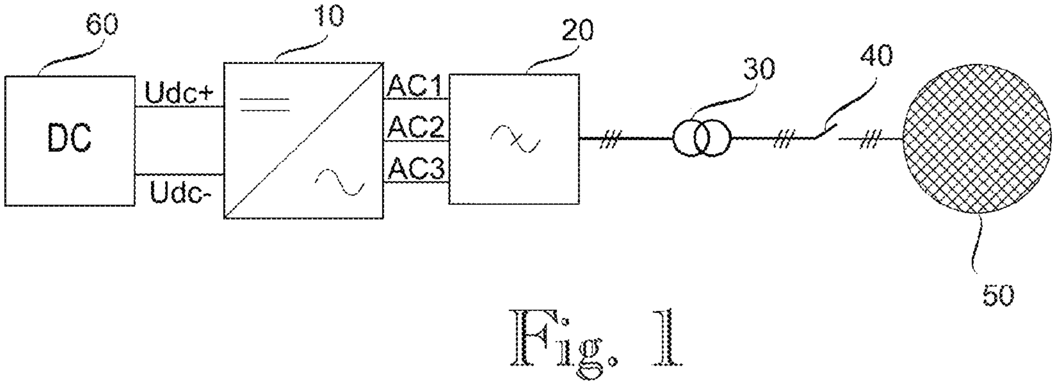
FIG. 1 illustrates an example of a system according to an embodiment.

FIG. 1 illustrates a simplified example of an electric system according to an embodiment. The exemplary system of FIG. 1 comprises an electric power converter 10, which in this example is an inverter, which can operate at least as a DC-to-AC converter. Consequently, the exemplary electric power converter 10 may comprise a suitable electronic device or circuitry that is able to convert direct current (DC) to alternating current (AC). The electric power converter 10 may be configured to operate as a single-stage inverter or as a multi-stage inverter and hence comprise two or more converter stages, for instance. The exemplary electric power converter 10 could also be configured to function both as a rectifier and as an inverter, i.e., to be able to rectify alternating current into direct current and convert direct current into alternating current depending on its mode of operation, for example. The circuit configuration of the electric power converter 10 may vary and the electric power converter 10 may generally be any kind of electric power converter comprising at least one inverter or corresponding functionality, for instance. As an example, the electric power converter could be a frequency converter. Herein term ‘inverter’ generally refers to an electronic device or circuitry, for example, that is able to convert direct current to alternating current, and term ‘rectifier’ generally refers to an electronic device or circuitry, for example, that is able to convert alternating current to direct current. Moreover, instead of three phases, as in the illustrated example, the converter 10 could have another number of AC phases, such as one, two or six phases, for example.

According to an embodiment, the electric power converter 10 may be configured to be operable at least in a grid-forming manner, i.e. in a grid-forming mode of operation. Thus, the electric power converter 10 may be capable of creating a stable voltage in the AC output thereof. This may include providing and sustaining (maintaining), by the electric power converter 10, an AC voltage of a predetermined magnitude and a predetermined frequency at the AC output of the converter 10. The electric power converter 10 can use its own voltage and frequency references for this purpose, for instance. According to an embodiment, the electric power converter 10 may be configured to be additionally operable in a grid-following manner, i.e. in a grid-following mode of operation. Thus, the electric power converter 10 may be able to operate both in the grid-forming manner and in the grid-following manner depending on the situation, for instance. As an example, the electric power converter 10 may be configured to operate in the grid-following manner in a grid connected situation, when the converter is connected to a grid with a stable voltage provided by one or more other entities connected to the network, whereby the electric power converter 10 can in the grid-following mode of operation synchronize itself with the already established voltage of such grid. As another example, electric power converter 10 may be configured to operate in the grid-forming mode of operation e.g. in an islanding (islanded) situation, i.e. when the power converter is without such grid connection to a stable grid (e.g. a wide area synchronous grid, i.e. a macrogrid) and needs to create the AC network by itself, for example. Such AC network possibly created by the electric power converter 10 may also be referred to as a stand-alone (micro) grid or an isolated (micro) grid.

In the example of FIG. 1 the exemplary electric power converter 10 is connected to a power source 60. In the example of FIG. 1 the power source is a DC power source to which DC poles Udc+, Udc− of the exemplary electric power converter 10 are connected. There may be one or more switches (not shown) between the electric power converter 10 and the DC power source 60 enabling the (electric) connection and disconnection of the 20 electric power converter to/from the DC power source. An example of such a DC power source 60 a photovoltaic (PV) power generation system comprising one or more photovoltaic panel, for instance. Another example of a possible DC power source 60 is a wind power generation system, such as a wind farm, which may comprise one or more wind generators, driven by one or more wind turbines, for instance. Such wind generator may be an AC (synchronous or asynchronous) generator provided with suitable rectifier means or a DC generator, for example. Other type(s) of DC power source(s) or combinations thereof could also be utilized alternatively or additionally, such as a fuel cell DC power source. Depending on the type of the electric power converter 10, it could also be connected to an AC power source, for example.

Further in the example of FIG. 1, an AC output of the electric power converter 10, represented by exemplary AC poles AC1, AC2, AC3 in exemplary FIG. 1, is connected to (a first side of) an output filter 20. Such an output filter (AC filter) 20 may be used for filtering harmonics produced by the electric power converter 10, for example. Some possible examples of the type of the output filter 20 include an LCL filter, an LC filter and an LLCL filter, for instance. Generally, the output filter 20 may be essentially a passive filter. According to an embodiment, the output filter 20 may have at least one filter inductance. The (each) filter inductance may comprise one or more inductors. According to an embodiment, the output filter 20 may have at least one filter capacitance. The (each) filter capacitance may comprise one or more capacitors. As an example, an LCL filter may have, for each phase, a first filter inductance and a second filter inductance connected in series and a filter capacitance connected to a connection point of the first and second filter inductances. As another example, an LC filter may have, for each phase, one filter inductance and one filter capacitance. As a further example, an LLCL filter may have, for each phase, a first filter inductance and a second filter inductance connected in series and a series connection of a third filter inductance and a filter capacitance connected to a connection point of the first and second filter inductances. In the previous examples the corresponding filter inductances and filter capacitances for each phase, when there are more than one phases, may be assumed equal. Consequently, the filter, such as an LCL, LC or LLCL filter, may be modelled by the values of such filter inductance(s) and filter capacitance, or more generally impedances, as (physical) model parameters of the filter. While exemplary FIG. 1 shows the output filter 20 as a separate element, it could be structurally part of the electric power converter 10, e.g. provided within a common housing. In the example of FIG. 1, the second side of the output filter 20 is connected to (a primary of) a transformer 30, which in the illustrated example is a three-phase transformer. The transformer 30 may be used for adjusting the output voltage of the electric power converter 10 to a higher value (e.g. act as a step-up transformer) or to a lower value (e.g. act as a step-down transformer), according to a voltage transformation ratio of the transformer, and/or to provide isolation between the electric power converter 10 and the AC network 50, for example.

The example of FIG. 1 further shows a controllable switch 40 provided between (a secondary of) the transformer 30 and the AC network 50. The controllable switch (or switching device) 40 may be any kind of manually controllable (operated and/or powered) and/or electronically controllable (operated and/or powered) switch with which the secondary of the transformer 30, and thus also the AC output of the electric power converter 10 can be (electrically) connected to and disconnected from the AC network 50. As an example, the switch 40 could be a (circuit) breaker, a disconnector, or a combination thereof, for example. In the illustrated example the controllable switch 40 may be a three-phase switch. The controllable switch 40 may have at least a first switching position and a second switching position, such that in the first switching position thereof the controllable switch 40 may be configured to (electrically) disconnect the secondary side of the transformer 30 from the AC network 50 and in the second switching position thereof the controllable switch may be configured to (electrically) connect the secondary side of the transformer 30 to the AC network 50. Thus, in the first switching position thereof the controllable switch 40 may essentially open-circuit the secondary side of the transformer 30. The AC network 50 may be an electrical grid or another kind of AC network into which power from the DC power source 60 (or from an AC power source) may be supplied via the electric power converter 10, when the electric system is in normal operation. As an example, the electric power converter 10 may be configured to operate in the grid-following manner in a situation, when the converter 10 is connected to the AC network 50. As another example, the electric power converter 10 may be configured to operate in the grid-forming mode of operation, when the power converter 10 is disconnected from the AC network 50, or generally in an islanding (islanded) situation, for example. When operating in the grid-forming mode of operation, the magnitude and frequency of the AC voltage provided and sustained at the AC output of the electric power converter 10 may be suitably selected and may essentially correspond to nominal or typical values (or value ranges) used in operation in the grid-following mode of operation, when connected to the AC network 50, or differ therefrom, for instance. The AC connection between the electric power converter 10 and the AC network 50, and thus also the AC output of the electric power converter 10, may generally have one or more phases, e.g. three phases as illustrated in the example of FIG. 1. The exemplary electric system may further comprise any number of additional components, such as switches, filters and/or fuses, which have not been shown in the figure for the sake of clarity.

Figure 2:
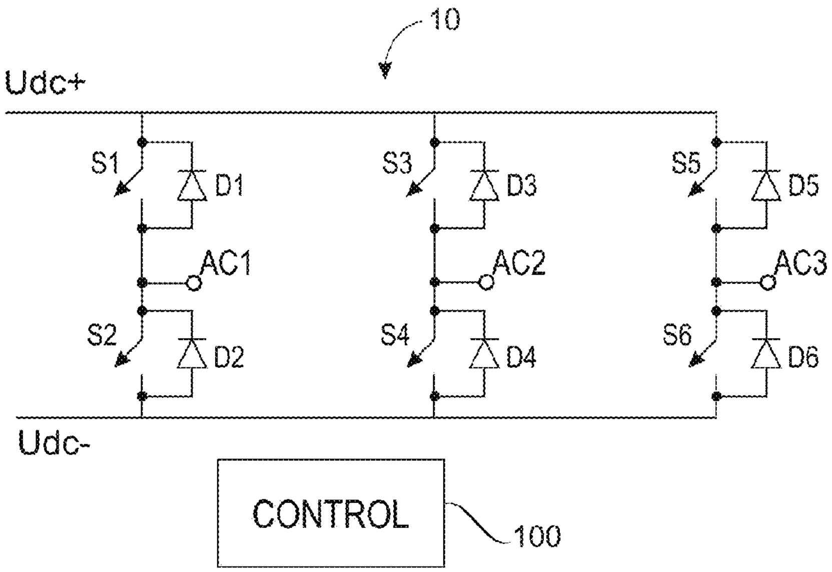
FIG. 2 illustrates an example of an electric power converter according to an embodiment.

FIG. 2 illustrates an example of an electric power converter (device, apparatus) 10 according to an embodiment. The exemplary electric power converter of FIG. 2 is a two-level three-phase converter that can function both as an inverter and also as a rectifier, and the main circuit thereof comprises three switching branches. The number of levels and phases of the electric power converter 10 could vary from the illustrated example. As an example, the electric power converter 10 could be a multilevel, e.g. three-level, converter, such as an NPC (Neutral Point Clamped) converter or an ANPC (Active Neutral Point Clamped) converter, for example. In the exemplary two-level configuration of FIG. 2, the first switching branch comprises controllable semiconductor switches S1 and S2, and their antiparallel diodes D1 and D2, respectively. The second switching branch comprises controllable semiconductor switches S3 and S4, and their antiparallel diodes D3 and D4, respectively. The third switching branch comprises controllable semiconductor switches S5 and S6, and their antiparallel diodes D5 and D6, respectively. The controllable semiconductor switches S1 to S6 may be any kind of controllable power semiconductor switches, such as IGBTs (Insulated-Gate Bipolar Transistor) or FETs (Field-Effect Transistor), which can be controlled according to a modulation or control scheme used, for example. The number and configuration of the controllable semiconductor switches may vary from the illustrated example depending on the converter characteristics, for example.

The exemplary electric power converter 10 of FIG. 2 further comprises a control arrangement 100, which may be configured to control the operation of the electric power converter 10. For the sake of clarity, no internal control connections between the control arrangement 100 and other components of the electric power converter 10, such as the controllable semiconductor switches S1 to S6, are shown in the figure. The control arrangement 100 may be comprised of one or more physical and/or logical units and one control arrangement 100 could control a plurality of electric power converters 10, for example. The control arrangement 100 may also be configured to perform various measurements, e.g. current and/or voltage measurements, in the electric power converter 10 and/or other entities connected to the electric power converter 10, such as the AC network 50. Such measurements may be implemented by means of suitable measuring arrangements, e.g. within the electric power converter 10, which have not been shown separately in the figure. The functionality according to the various embodiments described herein may be implemented at least partly by means of the control arrangement 100. Moreover, the control arrangement 100 may also control the normal operation of the electric power converter 10 by controlling the controllable semiconductor switches S1 to S6 in a suitable manner according to a modulation scheme or control scheme used, for example. An example of a possible modulation scheme is a pulse width modulation (PWM). According to an embodiment, the normal operation of the electric power converter 10 may include converting by the electric power converter 10 power from a power source into AC power supplied to the AC network 50 connected to the AC output the electric power converter 10.

Figure 3:
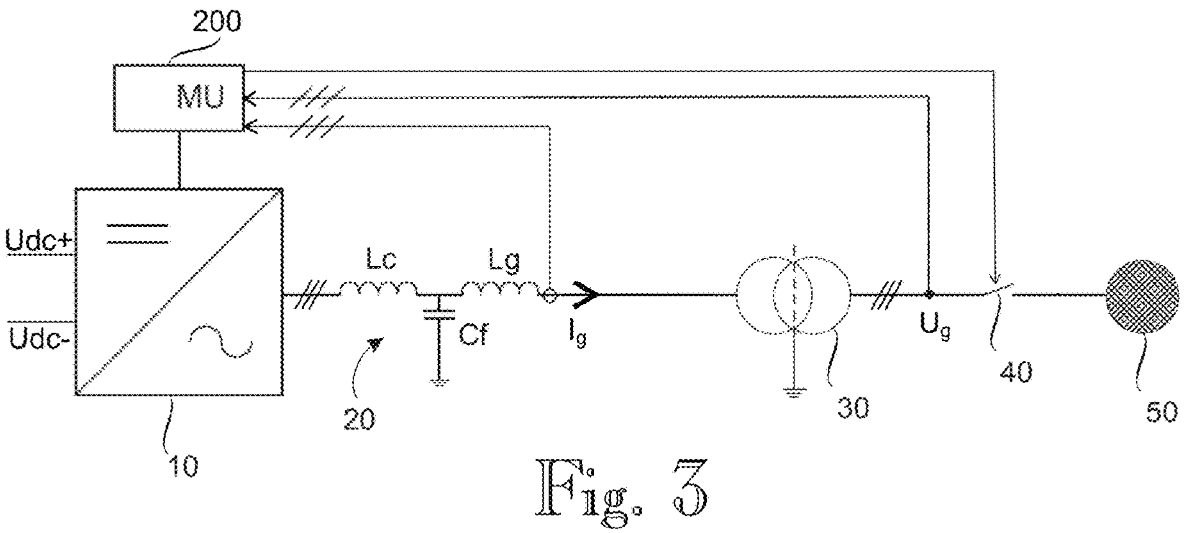
FIG. 3 illustrates an example of a system according to an embodiment.

FIG. 3 illustrates a simplified example of an electric system according to an embodiment. The example of FIG. 3 essentially corresponds to that of FIG. 1, but in contrast to the example of FIG. 1, the system further shows a measuring arrangement 200 connected to (or included in) the electric power converter 10. Such an exemplary measuring arrangement 200, or corresponding functionality provided by one or more functional units, may be provided to perform e.g. current and/or voltage measurements in the system e.g. together with suitable current and/or voltage sensors within the system. In the illustrated example the measuring arrangement 200 is configured to perform measurements of current $I_g$ flowing from the second side of the filter 20 towards the transformer 30 and voltage $U_g$ appearing on the secondary side of the transformer 30. Such measurements of current and/or voltage quantities could be performed from all the phases or only from one phase or some of the phases. As an example, assuming a three-phase system is essentially symmetrical, it is possible to measure the values of current and/or voltage quantities from e.g. only two phases and then calculate the values for the third phase. The exemplary measuring arrangement 200 may also be configured to control the switch 40. Consequently, the electric power converter 10, e.g. the control arrangement 100 thereof, may perform measurements via or by the measuring arrangement 200, by at least receiving measuring results from the measuring arrangement 200. Alternatively, or additionally, the electric power converter 10, e.g. the control arrangement 100 thereof, may control the switch 40, e.g. the switching position thereof, via the measuring arrangement 200, for example. The electric power converter 10, e.g. the control arrangement 100 thereof, could also be configured to directly control the switch 40, e.g. the switching position thereof. FIG. 3 further illustrates an example of the output filter (AC filter) 20, which in the example is an LCL filter having a filter capacitance $C_f$ and two filter inductances $L_c$, $L_g$. The simplified example shows the filter 20 components $C_f$, $L_c$, $L_g$ for one phase only. Thus, in a multi-phase system, e.g. in a three-phase system, the exemplary LCL filter has one such filter capacitance $C_f$ and two such filter inductances $L_c$, $L_g$ in each of the phases. The filter capacitance $C_f$ (in each phase) has an impedance $X_f$ (essentially capacitive reactance when ignoring any internal resistance), which may be provided by one or more capacitors. The first filter inductance $L_c$, or converter side inductance, (in each phase) has an impedance $X_c$ (essentially inductive reactance when ignoring any resistance), which may be provided by one or more inductors. The second filter inductance $L_g$, or grid side inductance, (in each phase) has an impedance $X_g$ (essentially inductive reactance when ignoring any internal resistance), which may be provided by one or more inductors.

Figure 4:
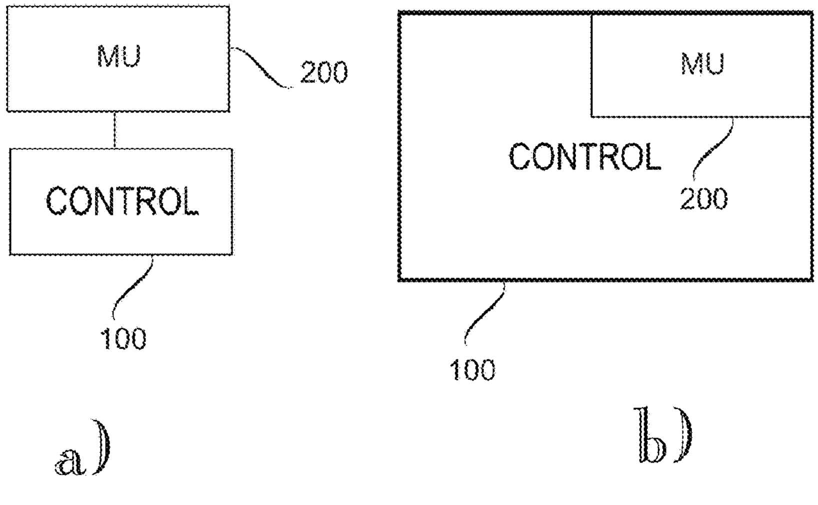
FIG. 4 illustrates a block diagram according to an embodiment.

FIG. 4 illustrates a block diagram according to an embodiment. As illustrated in FIG. 4, the measuring arrangement 200, or generally any such measuring means, could be implemented separately by means of suitable measuring unit or units capable of performing measurements in the system e.g. together with suitable sensors within the system. In such a case the control arrangement 100 of the converter 10 may be connected to the measuring arrangement in order to be able to receive measured data from the measuring arrangement 200 and/or to send control data to the measuring arrangement, as exemplified in alternative a) of FIG. 4. Alternatively, as exemplified in alternative b) of FIG. 4, the measuring arrangement 200, or the corresponding functionality, may be implemented within the control arrangement 100 of the converter 10, e.g. as one or more functional units thereof.

Figure 5:
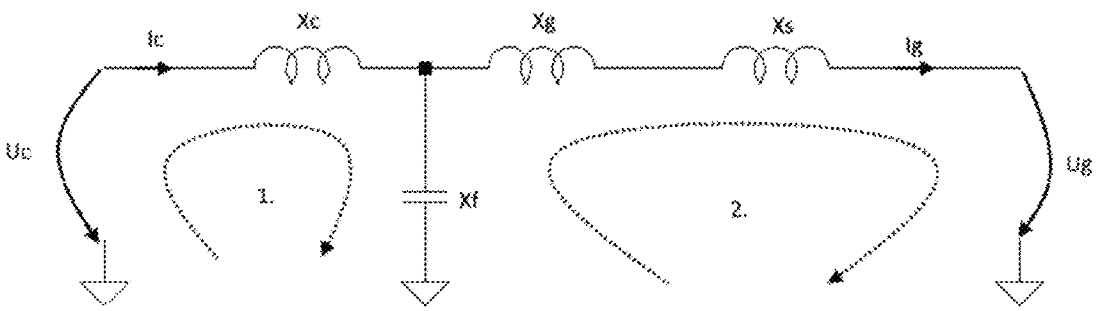
FIG. 5 illustrates an example of a circuit diagram according to an embodiment.

FIG. 5 illustrates an example of a circuit diagram according to an embodiment. The figure illustrates a simplified single-phase equivalent representation of the output filter 20 and the transformer 30 shown in the example of FIG. 3 during a time when the controllable switch 40 is in the first switching position and thus the secondary side of the transformer 30 is disconnected from the AC network 50. In the simplified example, an excitation inductance of the transformer 30, which enables current $I_g$ flow, has been omitted. In particular, FIG. 5 shows impedance $X_f$ of the filter capacitance $C_f$, impedance $X_c$ of the first filter inductance (i.e. converter side inductance) $L_c$, and impedance $X_g$ of the second filter inductance (i.e. grid side inductance) $L_g$. Moreover, the exemplary equivalent circuit of FIG. 5 shows a leakage impedance $X_s$ of the transformer 30. Moreover, $I_c$ is the output current of the electric power converter 10. $I_g$ and $U_c$ is the output voltage of the electric power converter 10. $I_g$ and $U_g$ are the current and voltage in the circuit as shown also in FIG. 5.

Based on the circuit diagram of FIG. 5, the following equations can be written for the two loops, 1., and 2., in the circuit of FIG. 5:

$$\text{Loop 1.: } U_C = I_c(X_c = X_f) - I_g X_f$$

$$\text{Loop 2.: } -U_g = -I_c X_f + I_g(X_f + X_g + X_s)$$

And from the above equations, the leakage impedance $X_s$ of the transformer 30 can be solved as follows:

$$U_c - U_g = I_c(X_c + X_f) - I_c X_f + I_g(X_f + X_g + X_s) - I_g X_f$$

$$U_c - U_g = I_c X_c + I_g(X_g + X_s)$$

$$X_s = \frac{(U_c - U_g) - I_c X_c - I_g X_g}{I_g}$$

In the above calculation (or prior to the calculation) the voltage transformation ratio of the transformer 30 should be properly taken into account for voltage $U_g$ which is measured from the secondary side of the transformer.

Thus, in case of an LCL filter, the leakage impedance $X_s$ of the transformer 30 can be calculated from the voltage values $U_c$ and $U_g$, current values $I_c$ and $I_g$ and the impedance values $X_c$ and $X_g$ of the first filter inductance (i.e. converter side inductance) $L_c$ and the second filter inductance (i.e. grid side inductance) $L_g$ impedance. In case of an LLCL filter the leakage impedance $X_s$ of the transformer 30 could be calculated essentially in a similar manner. And in case of an LC filter the leakage impedance $X_s$ of the transformer 30 could be calculated in a similar manner but using only the impedance value of the single filter inductance, for example.

According to an embodiment, a method is provided for determining a leakage impedance of a transformer 30 in a system comprising an electric power converter 10, an output filter 20 connected to an AC output of the electric power converter, wherein the AC output of the electric power converter 10 has one or more phases, and a transformer 30 with a primary side and a secondary side, wherein the primary side of the transformer 30 is connected to the output filter 20 and wherein a secondary side of the transformer 30 is configured to be connected to an AC network 50. According to an embodiment, the method comprises obtaining by the electric power converter 10 measured values of a first voltage $U_c$ and a first current $I_c$ in the AC output of the electric power converter 10, a measured value of a second voltage $U_g$ on the secondary side of the transformer 30, and a measured value of a second current $I_g$ between the output filter 20 and the primary side of the transformer 30, wherein the values have been measured when the secondary side of the transformer 30 is disconnected from the AC network 50. The method further comprises determining, by the electric power converter 10, the leakage impedance $X_s$ of the transformer on the basis of the obtained values of the first voltage $U_c$, the first current $I_c$, the second voltage $U_g$ and the second current $I_g$, and at least one predetermined impedance parameter value of the output filter.

Thus, according to an embodiment, the electric power converter 10 may obtain the values of the first voltage $U_c$, the first current $I_c$, the second voltage $U_g$ and the second current $I_g$ measured when the secondary side of the transformer 30 is disconnected from the AC network 50, i.e. the secondary of the transformer 30 may be essentially open-circuited during the measuring of the values, whereby essentially no current flows in the secondary of the transformer 30 during the measuring of the values. According to an embodiment, the electric power converter 10 may be operated (configured to operate) in the grid-forming mode of operation during the measuring of said values, when the electric power converter 10 is disconnected from the AC network 50. In other words, when the electric power converter 10 is disconnected from the AC network 50, and hence essentially in an islanding (islanded) situation, the electric power converter 10 may form a stand-alone, i.e. isolated, (micro) grid between the AC output of the electric power converter 10 and the switch 40, for example. The measuring of the voltage and current values may then be carried out during such grid-forming mode of operation of the electric power converter 10, whereby the electric power converter 10 thus generates the AC voltage(s) in its AC output, and the resulting AC current(s), enabling the measurements to be carried out. According to an embodiment, the obtaining of the measured value(s) may comprise measuring the value(s) and/or receiving measured value(s). Thus, the electric power converter 10 may obtain (acquire) the measured voltage and current values by measuring the value(s) itself and/or by receiving measured value(s) e.g. from another system entity performing the measuring. As an example, the electric power converter 10 may measure e.g. the values of the voltage $U_c$ and the current $I_c$ of the AC output of the electric power converter 10 itself and further receive the corresponding measured values of the voltage $U_g$ on the secondary side of the transformer 30, and the value of the current $I_g$ flowing between the output filter 20 and the primary side of the transformer 30 from or via the possibly separate measuring arrangement 200. All the voltage and current values may be measured essentially simultaneously or e.g. within a suitable measuring period when the secondary side of the transformer 30 is disconnected from the AC network 50. According to an embodiment, the electric power converter 10 may control the controllable switch 40 to disconnect the secondary side of the transformer 30 from the AC network 50 prior to obtaining the values of the first voltage, the first current, the second voltage and the second current. It is also possible that the controllable switch 40 is operated by another system entity, e.g. a higher-level control entity in the system, or manually operated to disconnect the secondary side of the transformer 30 from the AC network 50 prior to obtaining said values by the electric power converter 10, or at least prior to measuring said values regardless of how the actual measuring is implemented, for instance. In this case, the electric power converter 10 may receive an indication of the switching state of the controllable switch 40, e.g. for properly timing its possible own measurements.

According to an embodiment, after obtaining said values, the electric power converter 10 may calculate the leakage impedance $X_s$ of the transformer on the basis of the obtained values of the first voltage $U_c$, the first current $I_c$, the second voltage $U_g$ and the second current $I_g$, and the at least one predetermined impedance parameter value of the output filter 20, e.g. as explained above in connection with FIG. 5. 2. If the output filter 20 is an LCL filter having, for each phase of the AC output of the electric power converter, a first filter inductance and a second filter inductance connected in series and a filter capacitance connected to a connection point of the first and second filter inductances, the at least one predetermined impedance parameter value of the output filter may comprise an impedance value of the first filter inductance and an impedance value of the second filter inductance. If the output filter 20 is an LC filter having, for each phase of the AC output of the electric power converter, a filter inductance and a filter capacitance, the at least one predetermined impedance parameter value of the output filter may comprise an impedance value of the filter inductance. And if the output filter 20 is an LLCL filter having, for each phase of the AC output of the electric power converter, a first filter inductance and a second filter inductance connected in series and a series connection of a third filter inductance and a filter capacitance connected to a connection point of the first and second filter inductances, the at least one predetermined impedance parameter value of the output filter may comprise an impedance value of the first filter inductance and an impedance value of the second filter inductance. The at least one predetermined impedance parameter value of the output filter 20 may be stored in the electric power converter 10, e.g. in a memory located therein, or the at least one predetermined impedance parameter value of the output filter 20 may be received by the electric power converter 10 from another system entity whenever needed for the calculation, for instance.

According to an embodiment, an electric power converter comprises an AC output having one or more phases and obtaining means configured to obtain measured values of a first voltage and a first current in the AC output of the electric power converter, a measured value of a second current between an output filter connected to the AC output of the electric power converter and a primary side of a transformer connected to the output filter and a measured value of a second voltage on a secondary side of the transformer, wherein the secondary side of the transformer is configured to be connected to an AC network and wherein said values have been measured when the secondary side of the transformer is disconnected from the AC network. The electric power converter further comprises determining means configured to determine a leakage impedance of the transformer on the basis of the obtained values of the first voltage, the first current, the second current and the second voltage, and at least one predetermined impedance parameter value of the output filter. According to an embodiment, the obtaining means may be configured to control controllable switching means connected to the secondary side of the transformer to disconnect the secondary side of the transformer from the AC network prior to the obtaining of the values of the first voltage, the first current, the second voltage and the second current.

According to an embodiment, the determining of the leakage impedance of the transformer 30 by the electric power converter 10 may be performed at predetermined intervals, e.g. at regular intervals, and/or based on an instruction received by the electric power converter 10 to perform the determining, for example. Such instruction may be sent from a higher-level control system and/or form an operator or a user of the electric power converter 10, for instance.

Figure 6:
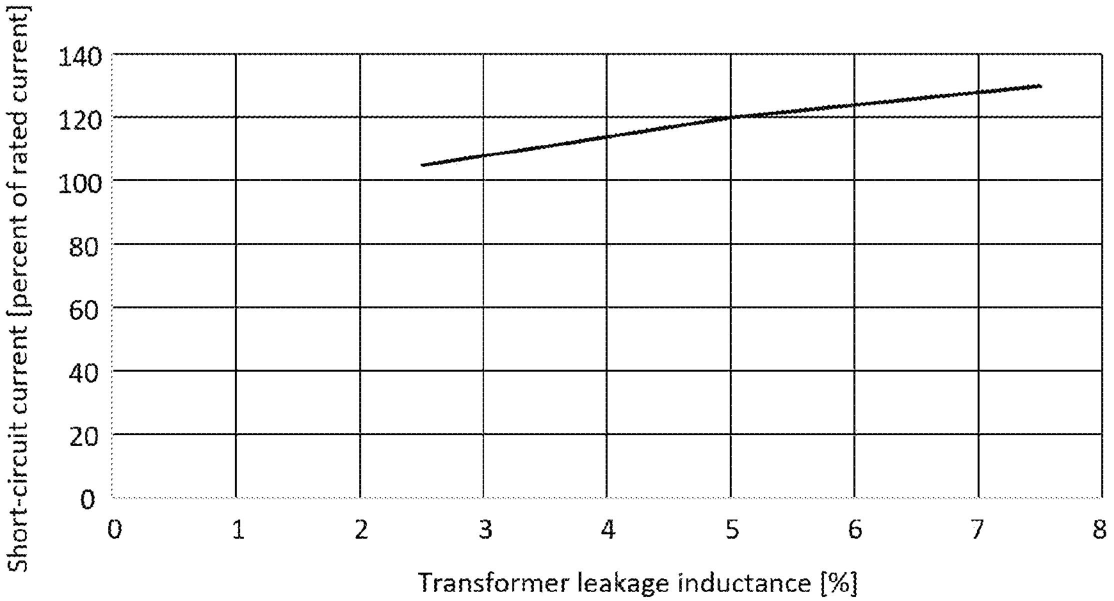
FIG. 6 illustrates a diagram according to an embodiment.

According to an embodiment, the determined leakage impedance of the transformer 30 may be used for determining a short-circuit current supply capability (rating) of the electric power converter 10. The short-circuit current supply capability (rating) may refer to the level and/or duration of the short-circuit current that the electric power converter 10 may supply in view of the determined leakage impedance of the transformer 30. The short-circuit current supply capability may be utilized e.g. in the protection of the system. It may be advantageous that the short-circuit current level is as high as possible with respect to a rated (nominal) output current of the electric power converter 10 and hence an object may to maximize the short-circuit current level, for example. FIG. 6 shows a diagram illustrating an example of how the magnitude of the leakage impedance of the transformer may affect the level of the short circuit current that the electric power converter 10 is capable of providing. According to an embodiment, the determined leakage impedance of the transformer 30 may thus be used by the electric power converter 10 for determining the maximum short-circuit current supply capability (rating) of the electric power converter 10. As an example, due to possible delays in the control of the electric power converter 10, the maximum short-circuit current supplied by the electric power converter 10 may need to be restricted to a lower level, when the leakage impedance of the transformer 30 has a lower value. This is because the leakage impedance of the transformer 30 restricts the rate of rise of the current and due to the delays in the control, with a small leakage impedance value, the current may need to be limited lower such that that it does not temporarily exceed an overcurrent cut-off limit due to delays, for example. On the other hand, when the leakage impedance of the transformer 30 has a higher value, it may be possible to allow a higher level for the maximum short-circuit current supplied by the electric power converter 10.

According to an embodiment, the determined leakage impedance of the transformer 30 and/or the possibly determined short-circuit current supply capability (rating) of the electric power converter 10 may be output from the electric power converter 10 to a user or operator of the electric power converter 10 and/or to another system entity, for example.

According to an embodiment, the determined leakage impedance of the transformer 30 may be used for the control of the electric power converter 10. For example, when utilizing a model-based control in the electric power converter 10, control errors may be reduced when accurate model parameters, such as the leakage impedance of the transformer, are known. As an example, a control response e.g. in non-steady state situations may improve because the effect of the adjustments made by the control on the grid voltage can be known more precisely. Moreover, it may be also possible to minimize the harmonics in the output current from the electric power converter 10 to the AC network 50 and/or to reduce power losses when the control of the of the electric power converter 10 knows the leakage impedance of the transformer 30 more accurately.

Some possible further advantages provided by the determination of the leakage impedance of the transformer 30 may include that an incorrect parametrization of the leakage impedance of the transformer can be avoided when the actual value is determined by the electric power converter 10 instead of using e.g. a predetermined value, which may be incorrect or outdated.

The control arrangement 100 and/or the measuring arrangement 200 and/or other means for implementing at least part of the functionality according to any one of the embodiments herein, or a combination thereof, may be implemented as one physical unit or as two or more separate physical units that are configured to implement the functionality. Herein the term ‘unit’ generally refers to a physical or logical entity, such as a physical device or a part thereof or a software routine. The control arrangement 100 and/or the measuring arrangement 200 or other means for implementing at least part of the functionality according to any one of the embodiments herein may be implemented at least partly by means of one or more computers or corresponding digital signal processing (DSP) equipment provided with suitable software, for example. Such a computer or digital signal processing equipment preferably comprises at least a working memory (RAM) providing storage area for arithmetical operations, and a central processing unit (CPU), such as a general-purpose digital signal processor. The CPU may comprise a set of registers, an arithmetic logic unit, and a control unit. The CPU control unit is controlled by a sequence of program instructions transferred to the CPU from the RAM. The CPU control unit may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The computer may also have an operating system which may provide system services to a computer program written with the program instructions. The computer or other apparatus implementing the various embodiments, or a part thereof, may further comprise suitable input means for receiving e.g. measurement and/or control data, and output means for outputting e.g. control or any other data, such as the determined leakage impedance of the transformer. It is also possible to use a specific integrated circuit or circuits, such as application-specific integrated circuits (ASIC), digital signal processing devices (DSPD), programmable logic devices (PLD), field-programmable gate arrays (FPGA) and/or discrete electric components and devices for implementing the functionality according to any one of the embodiments.

Many electric devices, such as electric power converters, and components thereof may comprise processors and memory that may be utilized in implementing the functionality according to the various embodiments described herein. Thus, at least some modifications and configurations possibly required for implementing an embodiment could be performed as software routines, which may be implemented as added or updated software routines. If at least part of the functionality of any of the embodiments is implemented by software, such software may be provided as a computer program product comprising computer program code which, when run on a computer, causes the computer or corresponding arrangement to perform the functionality according to the embodiments as described herein. Such a computer program code may be stored or generally embodied on a computer readable medium, such as suitable memory, e.g. a flash memory or an optical memory, from which it is loadable to the unit or units executing the program code. In addition, such a computer program code implementing any of the embodiments may be loaded to the unit or units executing the computer program code via a suitable data network, for example, and it may replace or update a possibly existing program code. An embodiment may provide a computer program comprising program instructions which, when executed by a controller of an electric power converter, cause the electric power converter to carry out a functionality according to any of the embodiments described herein. Moreover, an embodiment may provide such a computer program embodied on any computer-readable distribution/data storage medium or memory unit(s) or article(s) of manufacture, comprising such program instructions executable by a controller of an electric power converter. Generally, programs, also called program products, including software routines, program snippets constituting “program libraries”, applets and macros, can be stored in any medium and may be downloaded into an apparatus. In other words, each or some or one of the possible units/sub-units and/or algorithms for one or more functions/operations described above, for example by means of any of FIGS. 1 to 6 and any combination thereof, may be an element that comprises one or more arithmetic logic units, a number of special registers and control circuits, for example.

It will be obvious to a person skilled in the art that, as the technology advances, the inventive concept can be implemented in various ways. Further, it is clear to a person skilled in the art that the described exemplary embodiments may, but are not required to, be combined with other exemplary embodiments in various ways. The invention and its embodiments are not limited to the examples described above but may vary within the scope of the claims. If any of the exemplary embodiments and/or features described herein should not fall under the scope of the independent claims, those are to be interpreted as examples useful for understanding the various embodiments of the invention.

The invention claimed is:

1. A method for determining a leakage impedance of a transformer in a system comprising an electric power converter, an output filter connected to an AC output of the electric power converter, wherein the AC output of the electric power converter has one or more phases, and a transformer with a primary side and a secondary side, wherein the primary side of the transformer is connected to the output filter and wherein a secondary side of the transformer is configured to be connected to an AC network, the method comprising:

obtaining by the electric power converter measured values of a first voltage and a first current in the AC output of the electric power converter, a measured value of a second voltage on the secondary side of the transformer, and a measured value of a second current between the output filter and the primary side of the transformer, wherein the values have been measured when the secondary side of the transformer is disconnected from the AC network; and determining by the electric power converter the leakage impedance of the transformer on the basis of the obtained values of the first voltage, the first current, the second voltage and the second current, and at least one predetermined impedance parameter value of the output filter.

2. The method of claim 1, wherein the output filter comprises an LCL filter having, for each phase of the AC output of the electric power converter, a first filter inductance and a second filter inductance connected in series and a filter capacitance connected to a connection point of the first and second filter inductances, wherein the at least one predetermined impedance parameter value of the output filter includes an impedance value of the first filter inductance and an impedance value of the second filter inductance.

3. The method of claim 1, wherein the output filter comprises an LC filter having, for each phase of the AC output of the electric power converter, a filter inductance and a filter capacitance, wherein the at least one predetermined impedance parameter value of the output filter includes an impedance value of the filter inductance.

4. The method of claim 1, wherein the output filter comprises an LLCL filter having, for each phase of the AC output of the electric power converter, a first filter inductance and a second filter inductance connected in series and a series connection of a third filter inductance and a filter capacitance connected to a connection point of the first and second filter inductances, wherein the at least one predetermined impedance parameter value of the output filter includes an impedance value of the first filter inductance and an impedance value of the second filter inductance.

5. The method of claim 1, wherein the system comprises controllable switching means provided between the secondary side of the transformer and the AC network, wherein the method includes controlling by the electric power converter the controllable switching means to disconnect the secondary side of the transformer from the AC network prior to obtaining the values of the first voltage, the first current, the second voltage and the second current.

6. The method of claim 1, comprising operating the electric power converter in a grid-forming mode of operation during the measuring of the values of the first voltage, the first current, the second voltage and the second current.

7. A computer program product comprising program instructions embodied on a non-transitory computer readable medium which program instructions, when executed by a controller of an electric power converter, cause the electric power converter to carry out a method comprising:

obtaining by the electric power converter measured values of a first voltage and a first current in the AC output of the electric power converter, a measured value of a second voltage on the secondary side of the transformer, and a measured value of a second current between the output filter and the primary side of the transformer, wherein the values have been measured when the secondary side of the transformer is disconnected from the AC network; and determining by the electric power converter a leakage impedance of the transformer on the basis of the obtained values of the first voltage, the first current, the second voltage and the second current, and at least one predetermined impedance parameter value of the output filter.

8. An electric power converter, comprising:

an AC output having one or more phases; and a processor, and a memory storing instructions that, when executed by the processor, cause the electric power converter to:

obtain measured values of a first voltage and a first current in the AC output of the electric power converter, a measured value of a second current between an output filter connected to the AC output of the electric power converter and a primary side of a transformer connected to the output filter and a measured value of a second voltage on a secondary side of the transformer, wherein the secondary side of the transformer is configured to be connected to an AC network and wherein said values have been measured when the secondary side of the transformer is disconnected from the AC network; and determine a leakage impedance of the transformer on the basis of the obtained values of the first voltage, the first current, the second current and the second voltage, and at least one predetermined impedance parameter value of the output filter.

9. The electric power converter of claim 8, wherein when the output filter comprises an LCL filter having, for each phase of the AC output of the electric power converter, a first filter inductance and a second filter inductance connected in series and a filter capacitance connected to a connection point of the first and second filter inductances, the at least one predetermined impedance parameter value of the output filter includes an impedance value of the first filter inductance and an impedance value of the second filter inductance.

10. The electric power converter of claim 8, wherein when the output filter comprises an LC filter having, for each phase of the AC output of the electric power converter, a filter inductance and a filter capacitance, the at least one predetermined impedance parameter value of the output filter includes an impedance value of the filter inductance.

11. The electric power converter of claim 8, wherein when the output filter comprises an LLCL filter having, for each phase of the AC output of the electric power converter, a first filter inductance and a second filter inductance connected in series and a series connection of a third filter inductance and a filter capacitance connected to a connection point of the first and second filter inductances, the at least one predetermined impedance parameter value of the output filter includes an impedance value of the first filter inductance and an impedance value of the second filter inductance.

12. The electric power converter of claim 8, wherein the electric power converter is configured to control controllable switching means connected to the secondary side of the transformer to disconnect the secondary side of the transformer from the AC network prior to performing the obtaining of the values of the first voltage, the first current, the second voltage and the second current.

13. The electric power converter of claim 8, wherein the electric power converter is configured to operate in a grid-forming mode of operation during the measuring of the values of the first voltage, the first current, the second voltage and the second current.

14. The electric power converter of claim 8, wherein the electric power converter is configured to determine a maximum short-circuit current supply capability of the electric power converter on the basis of the determined leakage impedance of the transformer and/or configured to use the determined leakage impedance of the transformer for controlling the electric power converter.

15. A system comprising:

an electric power converter configured to obtain measured values of a first voltage and a first current in the AC output of the electric power converter, a measured value of a second voltage on the secondary side of the transformer, and a measured value of a second current between the output filter and the primary side of the transformer, wherein the values have been measured when the secondary side of the transformer is disconnected from the AC network, and to determine a leakage impedance of the transformer on the basis of the obtained values of the first voltage, the first current, the second voltage and the second current, and at least one predetermined impedance parameter value of the output filter;

an output filter having a first side and second side, wherein the first side is connected to the AC output of the electric power converter;

a transformer having a primary side and a secondary side, wherein the primary side of the transformer is connected to the second side of the output filter; and a controllable switching device connected to the secondary side of the transformer and having a first switching position and a second switching position, wherein in the first switching position the controllable switching device is configured to disconnect the secondary side of the transformer from the AC network and in the second switching position the controllable switching device is configured to connect the secondary side of the transformer to the AC network.

16. The system of claim 15, wherein the output filter is an LCL filter, an LC filter or an LLCL filter.

* * * * *